United States Patent [19]

Sumi

[11] 4,048,570
[45] Sept. 13, 1977

[54] MULTIPLE-BAND DIGITAL FREQUENCY SYNTHESIZER RECEIVER

[75] Inventor: Yasuaki Sumi, Tottori, Japan

[73] Assignees: Sanyo Electric Co., Ltd.; Tottori Sanyo Electric Co., Ltd., both of Moriguchi, Japan

[21] Appl. No.: 685,343

[22] Filed: May 11, 1976

[30] Foreign Application Priority Data

| May 30, 1975 | Japan | 50-65938 |
| May 30, 1975 | Japan | 50-65940 |
| Aug. 29, 1975 | Japan | 50-105286 |
| May 30, 1975 | Japan | 50-73699[U] |
| Oct. 17, 1975 | Japan | 50-143254[U] |

[51] Int. Cl.[2] .............................................. H04B 1/26
[52] U.S. Cl. .................................. 325/459; 325/464; 325/470
[58] Field of Search ............... 325/419, 453, 458, 459, 325/335, 464, 468, 470; 334/15; 331/1 A, 4, 1 B, 25

[56] References Cited

U.S. PATENT DOCUMENTS

| 3,803,494 | 4/1974 | Howell et al. | 325/459 |
| 3,961,261 | 6/1976 | Pflasterer | 325/459 |
| 3,962,644 | 6/1976 | Baker | 325/470 |

*Primary Examiner*—Robert L. Griffin
*Assistant Examiner*—Marc E. Bookbinder
*Attorney, Agent, or Firm*—Darby & Darby

[57] ABSTRACT

A multiple-band superheterodyne receiver, comprising a high frequency amplifier for receiving a high frequency signal, a local oscillator for providing an oscillation frequency signal the frequency of which is different by a given frequency difference from the received high frequency signal, a mixer for mixing these two frequency signals for providing an intermediate frequency signal, a band selecting switch, and means for setting the data concerning the frequency of a high frequency signal to be received, said local oscillator comprising a voltage controlled oscillator for providing an oscillation frequency signal the frequency of which is variable as a function of a given control voltage, a frequency divider for frequency dividing the output from the voltage controlled oscillator, a read only memory for storing the data concerning a plurality of frequency differences, each corresponding to one of said plurality of receiving frequency bands and responsive to the band selecting signal for selectively withdrawing the data concerning the corresponding frequency difference of the selected band, means responsive to the read only memory and the high frequency setting means for varying the rate of frequency division of the frequency divider to a value determined by the frequency difference and the set high frequency, and a phase detector responsive to a reference oscillator and the frequency divider for providing a control voltage associated with the frequency of the output from the frequency divider to the said voltage controlled oscillator, whereby the intermediate frequency of the said receiver is adaptably changed in response to the band selecting switch, with the result that the difference in the intermediate frequency is compensated which is caused depending on the receiving band, the broadcasting standard, and the like.

13 Claims, 12 Drawing Figures

MULTIPLE-BAND DIGITAL FREQUENCY SYNTHESIZER RECEIVER

BACKGROUND OF THE INVENTION

1. Field of the Invention;

The present invention relates to a multiple-band digital frequency synthesizer receiver. More specifically, the present invention relates to a multiple-band receiver employing a digital frequency synthesizer employing a phase locked loop.

2. Description of the Prior Art;

A typical prior art radio receiver comprises as a local oscillator for a tuner having a parallel resonance circuit comprising a coil and a capacitor, in which the inductance of the coil or the capacitance of the capacitor is varied to obtain a desired tuning frequency. However, such a local oscillator is liable to suffer fluctuations of the oscillation frequency caused by temperature characteristics of the coil, capacitor and the other oscillator components. Thus, it is rather difficult to obtain a stabilized oscillation frequency.

A digital frequency synthesizer has also been proposed and is in practical use. Such a frequency synthesizer is much more advantageous in that it can provide a much more stable oscillation frequency. A typical frequency synthesizer employs a phase locked loop, which is often simply referred to as "PLL".

A frequency synthesizer employing a phase locked loop usually comprises a voltage controlled oscillator, the oscillation frequency of which is controllable as a function of an output voltage, which is low pass filtered, obtainable from a phase detector, which is adapted to compare the phase or the frequency of the output from a reference oscillator and the phase or the frequency of an output from a programmable frequency divider adapted to frequency divide the output frequency from the said voltage controlled oscillator at a frequency division rate which is adapted to be variable as a function of a control signal. Automatic scanning of the oscillation frequency of the output from the said voltage controlled oscillator is effected by varying the said control signal and thus the frequency division rate of the programmable frequency divider. Therefore, if such a voltage controlled oscillator is used as a local oscillator of a tuner of a radio receiver, automatic scanning of the receiving band can be effected by varying the frequency division rate of the programmable frequency divider, as described above. If and when the frequency of a broadcasting station is tuned by the tuner, an output is obtained by the receiver, which is utilized to disable the variation of the frequency divider control signal.

The variable range of the frequency division rate of the programmable frequency divider should be determined depending on the range of the local oscillation frequency of the local oscillator for a given receiving band, such as an AM medium wave band, AM short wave band, FM band, or the like, and the frequency difference between the two adjacent broadcasting station frequencies, such that the receiver can receive any broadcasting frequency of a given receiving band. Thus, it is appreciated that the variable range of the frequency division rate of the programmable frequency divider should be different depending on the receiving band. For example, the Japanese standard for FM broadcasting has been determined as the range of receiving frequencies being 76 through 90 MHz, the intermediate frequency being 10.7 MHz, and an inter-station frequency being 100 KHz. This means that the local oscillation frequency should be varied 65.3 through 79.3 MHz, assuming that a lower sideband superheterodyne is employed. Accordingly, it is necessary that the frequency division rate of the programmable frequency divider be varied from 653 to 793. On the other hand, the Japanese standard for AM medium wave broadcasting has been determined as the range of receiving frequencies being 535 through 1605 KHz, the intermediate frequency being 455 KHz and the inter-station frequency being 10 KHz. This means the local oscillation frequency should be varied from 990 to 2060 KHz and accordingly the frequency division rate of the programmable frequency divider need be varied from 99 to 206, assuming that an upper sideband superheterodyne is employed.

Assuming that the receiving band is switched from a state of receiving FM broadcasting to a state of receiving AM broadcasting, the difference between the variable range of the frequency division rate of the programmable frequency divider for reception of FM broadcasting and the variable range of the frequency division rate of the programmable frequency divider for reception of AM broadcasting makes impossible the reception of AM broadcasting because of the receiving frequency in such a situation being outside of the range of the receiving band of AM broadcasting, if and when a receiver designed for reception for FM broadcasting is simply utilized for reception of AM broadcasting, and vice versa. Thus, in implementing a multiple-band radio receiver, it is necessary to provide a multiple number of frequency synthesizers each of which is adapted for reception of the corresponding broadcasting band. However, provision of a multiple number of frequency synthesizers complicates the structure of the receiver. It is desired that a multiple-band receiver with simplified structure be provided. Further it is desired that a multiple-band receiver be provided in which automatic scanning of the receiving band is effected from either the minimum or the maximum frequency of the receiving band when the receiving band is switched.

Assuming that there is provided an improved multiple-band receiver employing a digital frequency synthesizer which is capable of being switched to a plurality of receiving bands, another problem arises in connection with display of the broadcasting frequency to be received using the digital data obtainable from the said digital frequency synthesizer. As well known to those skilled in the art, in a superheterodyne receiver employing a typical digital frequency synthesizer employing a phase locked loop, the local oscillation frequency of the voltage controlled oscillator is selected to be higher or lower than the frequency of the broadcasting frequency to be received by the frequency difference commensurate with the intermediate frequency of the radio receiver, while the frequency division rate of the programmable frequency divider is varied so as to be proportional to the required local oscillation frequency of the voltage controlled oscillator. Hence, it is appreciated that the frequency to be received is proportional to the frequency division rate of the programmable frequency divider, with the frequency difference commensurate with the intermediate frequency. Because of this frequency difference, the frequency division rate of the programmable frequency divider can not be used directly for the purpose of displaying the frequency of the broadcasting signal to be received, in spite of the fact that the frequency division rate is of a digital nature and thus is easy for digital processing in general. Thus, it is desired that a multiple-band receiver be provided in which it is easy to display the frequency of a broadcasting signal to be received using the digital data obtainable from the digital frequency synthesizer.

Another problem encountered in connection with a multiple-band digital frequency synthesizer receiver is that the intermediate frequency is different depending on the receiving bands and in addition the intermediate frequency may be different even for the same receiving band, as the broadcasting standards including the intermediate frequency are different depending on the territory where the receiver is used. Thus, it is further desired that a multiple-band digital frequency synthesizer receiver be adapted to select a desired intermediate frequency in response to the band switching, thereby to compensate for the difference in the intermediate frequency caused depending on the receiving band, the broadcasting standard, and the like.

A further problem encountered in a superheterodyne radio receiver employing a digital frequency synthesizer is that the inter-station frequency, i.e., the frequency difference of adjacent broadcasting stations, is fixed which result in a dilemma that reception becomes impossible if the inter-station frequency is changed by way of revision of the broadcasting standard. Thus, it is desired that such inter-station frequency be achieved by such a frequency synthesizer receiver can be adaptably changed with ease.

SUMMARY OF THE INVENTION

Briefly stated, the present invention comprises a superheterodyne receiver, comprising means for receiving a high frequency signal, local oscillating means for providing an oscillation frequency signal the frequency of which is different by a given frequency difference from said received high frequency signal, and mixing means responsive to said received high frequency signal and said local oscillation frequency signal for providing an intermediate frequency signal, said local oscillating means comprising voltage controlled oscillating means for providing an oscillation frequency signal, the oscillation frequency of which is variable as a function of a given control voltage, means for modifying oscillation frequency of the output from said voltage controlled oscillating means, means for controlling the rate of frequency modification of said oscillation frequency modifying means, and means responsive to the output from said oscillation frequency modifying means, as modified at the frequency modification rate controlled by said frequency modification rate controlling means, for providing a control voltage associated with the frequency of the output from said oscillation frequency modifying means to said voltage controlled oscillating means, whereby said local oscillating means is adapted to provide a local oscillation frequency signal the frequency of which is associated with the frequency modification rate, as controlled by said frequency modification rate controlling means. The multiple-band superheterodyne receiver also includes means for selecting a plurality of receiving frequency bands and means for setting information concerning the frequency of a high frequency signal to be received, and that said frequency modification rate controlling means comprises means for storing information concerning a plurality of frequency differences, each corresponding to one of said plurality of receiving frequency band and responsive to the output from said band selecting means for selectively withdrawing the stored information concerning the corresponding frequency difference of the corresponding receiving frequency band, and means responsive to said information concerning said frequency difference and said information concerning the frequency of a high-frequency signal to be received for varying the rate of frequency modification of said oscillation frequency modifying means to a value associated with the sum or difference of said two pieces of information.

Therefore, it is a principal object of the present invention to provide an improved multiple-band superheterodyne receiver having a digital frequency synthesizer employing a phase locked loop in which it is easy to display the frequency of a broadcasting signal to be receive using the digital data obtainable from the digital frequency synthesizer.

It is another object of the present invention to provide an improved multiple-band superheterodyne receiver employing a digital frequency synthesizer having a phase locked loop, which is adapted to select a desired intermediate frequency in response to the band switching signal, thereby to compensate for the difference in the intermediate frequency caused depending on the receiving band, the broadcasting standard and the like.

It is a further object of the present invention to provide an improved multiple-band superheterodyne receiver employing a digital frequency synthesizer having a phase locked loop in which the inter-station frequency to be achieved by the said frequency synthesizer receiver can be adaptable changed with ease.

These objects and other objects, features, aspects and advantages of the present invention will be better understood from the following detailed description of the preferred embodiment of the present invention when taken in conjunction with the accompanying drawings.

Figure 1:
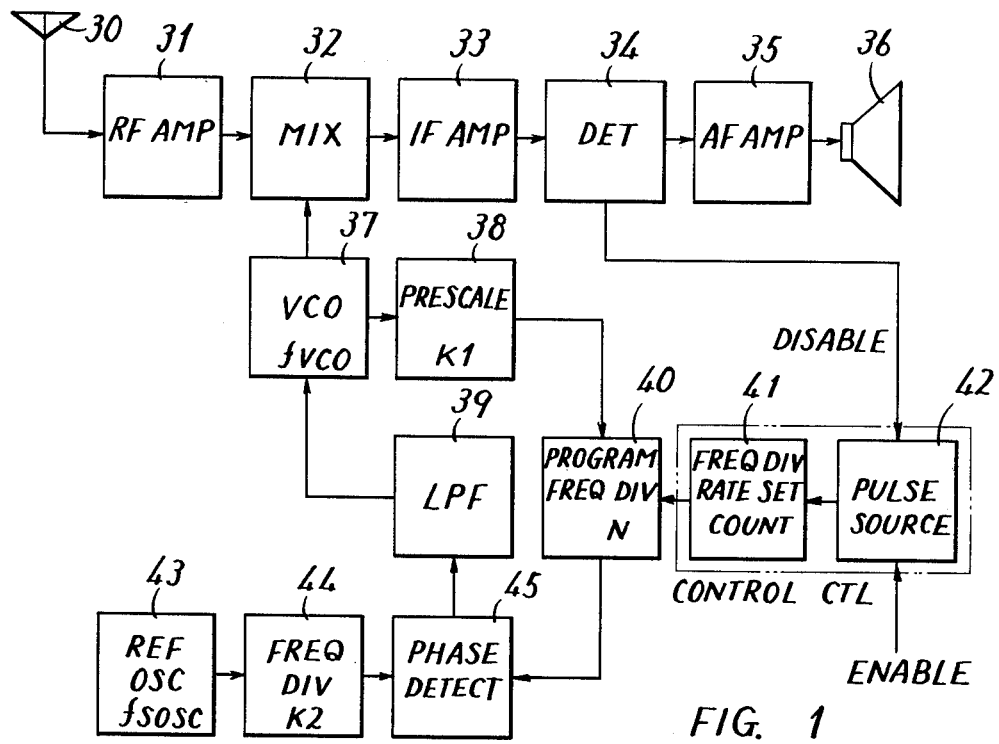
FIG. 1 is a block diagram of a radio receiver employing a typical digital frequency synthesizer employing a phase locked loop, in which the present invention can be advantageously employed.

DESCRIPTION OF THE PREFERRED EMBODIMENTS:

FIG. 1 is a block diagram of a radio receiver employing a typical digital frequency synthesizer having a phase locked loop, in which the present invention can be advantageously employed. The receiver shown comprises an antenna 30 for receiving a broadcasting wave, a radio frequency amplifier 31 for amplifying the received broadcasting wave, a mixer 32 for mixing the radio frequency output from the amplifier 31 with a local oscillation frequency output to be described subsequently for providing an intermediate frequency output, an intermediate frequency amplifier 33 for amplifying the intermediate frequency output from the mixer 32, a detector 34 for detecting the intermediate frequency output from the amplifier 33 for providing an audio frequency output, an audio frequency amplifier 35 for amplifying the audio frequency output from the detector 34, and a loud speaker 35 for transducing the audio frequency output from the amplifier 35 into a sound output. The mixer 32 is connected to receive a local frequency output from a voltage controlled oscillator 37 which serves as a local oscillator. The voltage controlled oscillator 37 is structured such that the oscillation frequency thereof is varied as a function of a control voltage applied thereto. In the receiver shown, such a control voltage is provided as an output from a phase detector 45, as filtered by means of a low pass filter 39. The phase detector 45 is connected to receive, at one input thereto, an output from a frequency divider 44, which is connected to receive an output from a reference oscillator 43. The phase detector 45 is also connected to receive, at the other input thereto, an output from a programmable frequency divider 40, which typically comprises a programmable counter. The programmable frequency divider 40 is connected to receive a pulse output from a prescaler 38 for the purpose of counting the number of pulses at the programmed rate and is also connected to receive a control signal from a control CTL for the purpose of controlling the said programmed rate. The prescaler 38 comprises a frequency divider for frequency dividing the output from the voltage control oscillator 37. The control CTL comprises a frequency division rate setting counter 41 for providing a set control signal to the programmable frequency divider 40 for setting the rate of counting by the counter 40 and a pulse source 42 for providing pulses to the setting counter 41. The pulse source 42 is adapted to start providing pulses to the counter 41 in response to an enable signal such as an input signal for starting automatic scanning of the receiving band for the purpose of tuning to a broadcasting station. The pulse source 42 is also adapted to stop providing pulses to the counter 41 in response to a disable signal which is obtainable if and when the receiver is tuned to a given broadcasting station frequency and an output is obtained from the detector 34, whereby a state of receiving the said broadcasting station frequency is established.

For the purpose of describing the operation of the FIG. 1. receiver, it is assumed that the oscillation frequency of the reference oscillator 43 is fsosc, the oscillation frequency of the voltage controlled oscillator 37 is fvco, the rate of frequency division by the prescaler 38 is 1/k1, the rate of frequency division by the frequency divider 44 is 1/k2, and the rate of frequency division by the programmable frequency divider 40 is 1/N. Then the following equation is obtained.

$$fsosc \cdot \frac{1}{K2} = \frac{1}{N} \cdot \frac{1}{K1} \cdot fvco \tag{1}$$

In general, in this type of frequency synthesizer, the relation K1 = K2 is adopted. Therefore, equation (1) may be expressed as follows.

$$fsosc = fvco \cdot \frac{1}{N} \tag{2}$$

Accordingly, the following equation is obtained.

$$fvco = N'fsosc \tag{3}$$

where N is an integral number.

By way of an example, assuming that fsosc = 100 KHz and N =0.718 then fvco = 71.8 MHz is obtained from equation (3). Therefore, further assuming that a receiving frequency fhigh is 82.5 MHz, these frequencies are applied to the mixer 32, whereby an intermediate frequency of 10.7 MHz is obtained, if and when a lower sideband superheterodyne is adopted, with the result that an FM broadcasting wave of 82.5 MHz can be received. Thus, variation of the frequency division rate N of the programmable frequency divider on a one-by-one basis from 653 to 793 enable reception of the frequencies of the stations at intervals of 100 KHz from 76.0 MHz to 90.0 MHz.

Various data concerning reception of the FM broadcasting signals in accordance with the Japanese standard are listed in the following.

| | |
|---|---|
| Range of FM frequencies | 76.0 MHz~90.0 MHz |
| Intermediate frequency | 10.7 MHz   10.7 MHz |
| Range of oscillation frequency | 65.3 MHz~79.3 MHz |
| Output from prescaler (1/100 FREQ. DIV) | 653 KHz~793 KHz |
| Range of counts by setting counter 41 | 653~793 | where a lower side superheterodyne is adopted and the reference frequency is 1 KHz, with the result that the count one by the setting counter 41 corresponds to the an inter-station frequency of 100 KHz.

Similarly, the data concerning reception of an AM broadcasting wave in accordance with the Japanese standard are listed in the following.

| | |
|---|---|
| Range of AM frequencies | 535 KHz~1605 KHz |
| Intermediate frequency | 455 KHz    455 KHz |
| Range of local oscillation frequency | 990 KHz~2060 KHz |
| Range of counts by setting counter 41 | 990~2060 | where the upper superheterodyne is adopted, the reference frequency is 1 KHz and the inter-station frequency is 10 KHz.

As seen from the equation (3), the oscillation frequency fvco of the voltage controlled oscillator 37, i.e., the local oscillation frequency, is the integral number N times the reference oscillation frequency fsosc of the reference oscillator 43, which usually comprises a crystal oscillator. Thus, it is appreciated that a frequency synthesizer of this type can be controlled in accordance with the stability and the precision of the oscillation frequency of a crystal oscillator and a radio receiver of high stability and a precise local oscillation frequency can be provided.

As described previously, a problem arises in implementing a radio receiver employing a digital frequency synthesizer which is capable of being switched to a plurality of receiving bands. Such a problem can be solved by an improvement in the control CTL in the FIG. 1 receiver.

Figure 2:
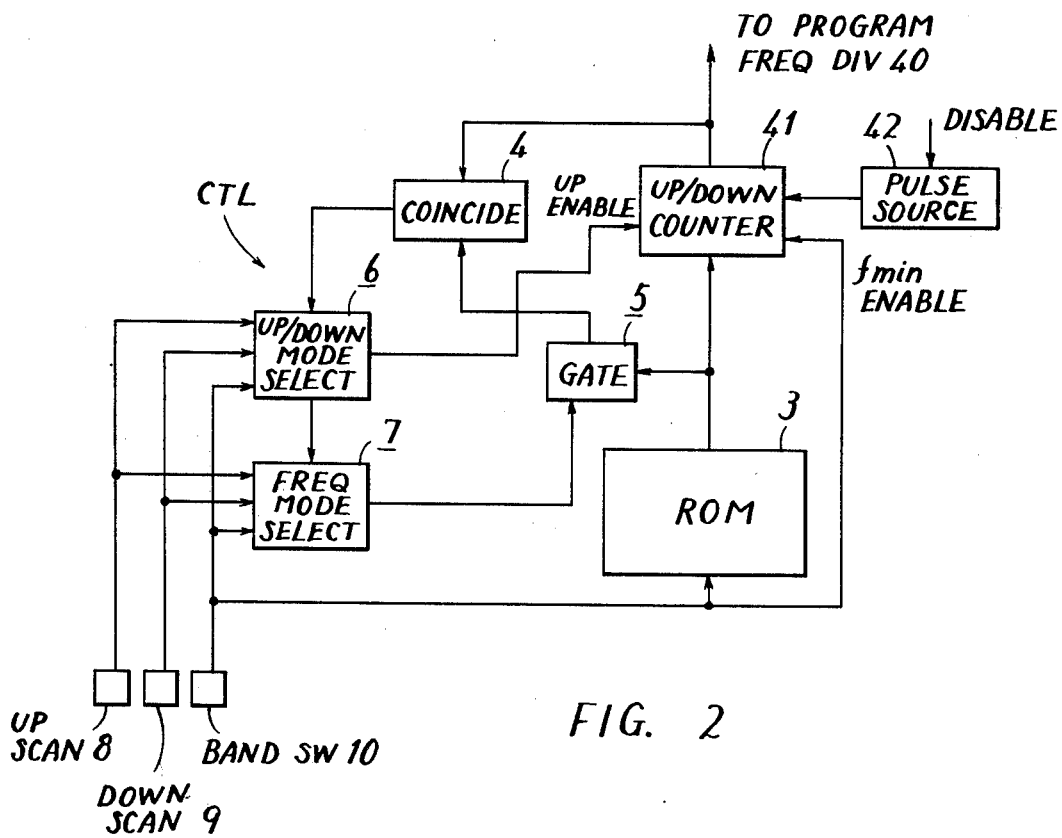
FIG. 2 is a block diagram of the control (CTL) employing the present invention.

FIG. 2 is a block diagram of the control CTL employing such an improvement. The setting counter 41 of the improved control CTL comprises an up/down counter 15 which is connected to receive the pulses from the pulse source 42 and to provide the set count output to the programmable frequency divider 40. In addition, the up/down counter 41 is structured such that it is controlled to be operative as an up counter upon receipt of an "up enable" mode selecting input while it is controlled to be operative as a down counter in the absence of the "up enable" input thereto. The up/down counter 41 is further structured such that it is initially preset to store the initial set count corresponding to the minimum frequency $f_{min}$ of a given band as a function of an "$f_{min}$ enable" input thereto. Such an initial set count corresponding to the minimum frequency of a given receiving band is selectively obtained from a read only memory (ROM) 3, which stores the respective initial set counts corresponding to the maximum and minimum frequencies $f_{max}$ and $f_{min}$, respectively, of a plurality of receiving bands. The read only memory 3 is structured such that it is responsive to a band selecting signal to selectively provide the said respective initial set counts corresponding to the maximum and minimum frequencies $f_{max}$ and $f_{min}$, respectively, of the corresponding receiving band. The output from the read only memory 3, as selectively read out, is also applied through a gate 5 to a coincidence circuit 4, which receives as another input thereto the output from the up/down counter 41, thereby to evaluate coincidence of the outputs from the read only memory 3 and the up/down counter 41. The coincidence output from the coincidence circuit 4 is applied to an up/down mode selecting circuit 6, which is responsive to an output from any one of an upward scanning switch 8, a downward scanning switch 9 and an output from a band selecting switch 10 to provide the said up enable signal to the up/down counter 41. The gate 5 serves to selectively pass therethrough either the count corresponding to the maximum frequency $f_{max}$ or the minimum frequency $f_{min}$ in a given receiving band to the coincidence circuit 4 in response to a frequency mode selecting signal obtainable from a frequency mode selecting circuit 7. The frequency mode selecting circuit 7 is structured to be responsive to the output from the upward scanning switch 8, downward scanning switch 9 and band selecting switch 10 and the upward-downward mode select output from the up-ward-downward mode selecting circuit 6 to provide the said frequency mode selecting signal. More specifically, the frequency mode selecting circuit 7 is structured such that it provides a maximum frequency selecting signal at the time of upward scanning and at the time of band switching and provides a minimum frequency selecting signal at the time of downward scanning, whereby the set count corresponding to the maximum frequency and the set count corresponding to the minimum frequency, respectively, in a given receiving band are selectively allowed to pass through the gate 5 to the coincidence circuit 4.

In operation, if and when the upward scanning switch 8 or the downward scanning switch 9 is depressed, while the band switch is depressed to select a desired one of a plurality of receiving bands, the read only memory 3 is controlled to provide the count values corresponding to the maximum frequency and the minimum frequency of the said desired receiving band and the up/down mode selecting circuit 6 and the frequency mode selecting circuit 7 are controlled to be in the upward scanning mode, so that the up/down mode selecting circuit 6 provides the up enable signal to the up/down counter 41, while the frequency mode selecting circuit 7 provides the maximum frequency selecting signal to the gate 5. As a result, the said desired receiving band is scanned in the upward direction to reach the maximum frequency of the said receiving band, when the coincidence output is obtained from the coincidence circuit 4, which reverses the state in the up/down mode selecting circuit 6 and the frequency mode selecting circuit 7. Therefore, the up enable signal is not obtained any more from the up/down mode selecting circuit 6 and the minimum frequency mode selecting signal is obtained from the frequency mode selecting circuit 7. As a result, the up/down counter 41 is made to operate as a down counter, while the count value corresponding to the minimum frequency is applied through the gate 5 to the coincidence circuit 4. Thus, the receiving band is scanned this time in the downward direction. If and when the minimum frequency is reached again, the coincidence output is obtained from the coincidence circuit 4 and accordingly the up/down mode selecting circuit 6 and the frequency mode selecting circuit 7 are brought to be in a reversed state. Therefore, the upward scanning of the receiving band is regained and thereafter the above described operation is repeated.

Figure 3:
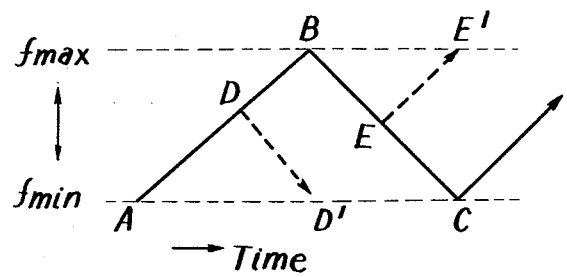
FIG. 3 is a graph showing a relation of frequency and time, in which the ordinate indicates frequency and the abscissa indicates time.

FIG. 3 is a graph showing a relation of the frequency and the time, in which the ordinate indicates the frequency and the abscissa indicates the time.

Figure 4:
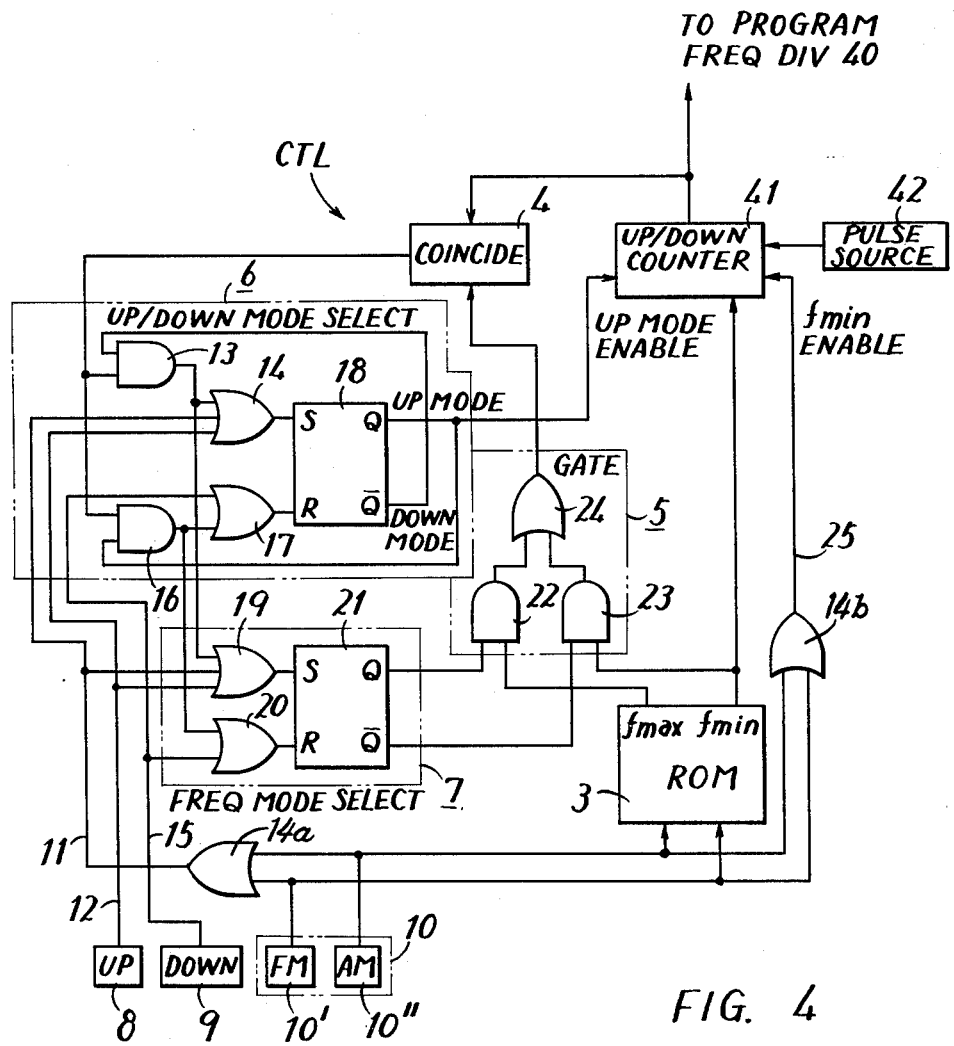
FIG. 4 is a more detailed block diagram of the control (CTL) of the FIG. 1 receiver.

FIG. 4 is a more detailed block diagram of the FIG. 2 control CTL. The up/down mode selecting circuit 6 comprises a flip-flop 18. The set input to the flip-flop 18 is connected from the output of an OR gate 14. One input to the OR gate 14 is connected through a line 11 from an output of an OR gate 14a the inputs of which are connected individually to an FM band selecting switch 10' and an AM band selecting switch 10", which were generally denoted by the reference numeral 10 in FIG. 2. Another input to the OR gate 14 is connected through a line 12 from the upward scanning switch 8. A further input to the OR gate 14 is connected to the output of an AND gate 13. One input to the AND gate 13 is connected from the reset output Q of the flip-flop 18, which represents the downward scanning mode. Another input to the AND gate 13 is connected to receive the coincidence output from the coincidence circuit 4. The reset input of the flip-flop 18 is connected from the output of an OR gate 17. One input to the OR gate 17 is connected through a line 15 to the downward scanning switch 9. Another input to the OR gate 17 is connected from the output of an AND gate 16. One input to the AND gate 16 is connected to receive the set output $\bar{Q}$ of the flip-flop 18, which represents the upward scanning mode. Another input to the AND gate 16 is connected to receive the coincidence output from the coincidence circuit 4. Thus, it is appreciated that the flip-flop 18 is set if and when the band selecting signal is received through the line 11 from either the band selecting switch 10' or 10", the upward scanning signal is received through the line 12 from the upward scanning switch 8, or the coincidence output is received from the coincidence circuit 4 while the control CTL is in the downward scanning mode, i.e., the reset output $\bar{Q}$ is obtained from the flip-flop 18. On the other hand, the flip-flop 18 is reset, if and when the downward scanning signal is received through the line 15 from the downward scanning switch 9 or the coincidence output is obtained from the coincidence circuit 4 while the control CTL is in the upward scanning mode, i.e., the set output Q is obtained from the flip-flop 18. The set output of the flip-flop 18 is applied to the up/down counter 41 as the up mode enable signal, whereby the up/down counter 41 is made to operate as an up counter. In the absence of the up mode enable signal applied to the counter 41, i.e., if and when the flip-flop 18 is reset, the up/down counter 41 is controlled to operate as a down counter.

The frequency mode selecting circuit 7 also comprises a flip-flop 21. The set input to the flip-flop 21 is connected from the output of an OR gate 19. One input to the OR gate 19 is connected to receive the upward scanning signal through the line 12 from the upward scanning switch 8. Another input to the OR gate 19 is connected to receive through the line 11 the band selecting signal from either the FM band selecting switch 10' or the AM band selecting switch 10". A further input to the OR gate 19 is connected to receive the output from the AND gate 13. The reset input to the flip-flop 21 is connected from the output of an OR gate 20. One input to the OR gate 20 is connected to receive through the line 15 the downward scanning signal from the downward scanning switch 9. Another input to the OR gate 20 is connected to receive the output from the AND gate 16. Thus, it is appreciated that the flip-flop 21 is set, if and when the band selecting signal is received through the line 11 from either the FM band selecting switch 10' or the AM band selecting switch 10", the upward scanning signal is received through the line 12 from the upward scanning switch 8, or the coincidence output is obtained from the coincidence circuit 4 while the control CTL is in the downward scanning mode, i.e., the flip-flop 18 is reset. On the other hand, the flip-flop 21 is reset, if and when the downward scanning signal is received through the line 15 from the downward scanning switch 9 or the coincidence output is obtained from the coincidence circuit 4 while the control CTL is in the upward scanning mode i.e., the flip-flop 18 is set. The set output of the flip-flop 21 is connected to one input of an AND gate 22 and the reset output from the flip-flop 21 is connected to one input of an AND gate 23. Another input to the AND gate 22 is connected to receive the preset count value or data concerning the maximum frequency of the read only memory 3 and another input to the AND gate 23 is connected to receive the present count value or data concerning the minimum frequency of the read only memory 3. The outputs from the AND gates 22 and 23 are connected to the inputs of an OR gate 24 and the output from the OR gate 24 is connected to one input of the coincidence circuit 4. The output of the data concerning the minimum frequency of the read only memory 3 is also connected to the data input of the up/down counter 41 for the purpose of setting the data concerning the minimum frequency as an initial setting data.

The band selecting outputs from the FM band selecting switch 10' and the AM band selecting switch 10" are connected through an OR gate 146 to the up/down counter 41 as the $f_{min}$ enable signal, thereby to enable the said data concerning the minimum frequency obtainable from the read only memory 3 to be loaded in the up/down counter as an initial setting data.

Now, operation of the control CTL shown in FIG. 4 will be described in the following. First let it be assumed that the FM and selecting switch 10' has been depressed and accordingly the receiver comprising the control CTL in FIG. 4 is in the state of receiving the FM broadcasting wave. Accordingly, the read only memory 3 is responsive to the FM band selecting signal from the switch 10' to be controlled to provide the data concerning the maximum and minimum frequencies of the FM band. If it is desired to effect upward scanning toward the maximum frequency in such a situation, the upward scanning switch 8 is manually operated, whereby the flip-flop 18 of the up/down mode selecting circuit 6 is set and the upward scanning mode is established. In such a situation the up/down counter 41 is made to operate as an up counter. At the same time the flip-flop 21 of the frequency mode selecting circuit 7 is also set, whereby the maximum frequency mode is established. In such a situation the AND gate 22 is enabled, whereby the data concerning the maximum frequency of 90 MHz is provided from the read only memory 3 to the coincidence circuit 4. The up/down counter 41 for setting the frequency division rate counts up upon receipt of each pulse from the pulse source 42, thereby to scan from the point A toward the point B, as shown in FIG. 3. If and when the broadcasting wave is received by the receiver shown in FIG. 1 in the course of an upward scanning, the output is obtained from the detector 34 and accordingly the pulse source 42 is disabled, with the result that no more pulses are applied to the up/down counter 41 and thus the state of receiving the broadcasting wave is maintained. If and when the maximum frequency of 90 MHz at the point B is reached, the coincidence output is obtained from the coincidence circuit 4, whereby the AND gate 16 is enabled and the flip-flop 18 is reset. Accordingly, the up/down mode selecting circuit 6 is switched to the downward scanning mode and accordingly the up/down counter 41 is also switched to operate as a down counter. The flip-flop 21 is also reset and accordingly the frequency mode selecting circuit 7 is also switched to the minimum frequency mode, whereby the minimum frequency of 76 MHz is applied from the read only memory 3 through the AND gate 23 and the OR gate 24 to the coincidence circuit 4. The up/down counter 41 is made this time to count down the pulses from the pulse source 42, thereby to make the downward scanning from the point B toward the point C. If and when the minimum frequency at the point C is reached, the states of the two flip-flops 18 and 21 are reversed. Thus, scanning of the frequency band is automatically reversed if and when the minimum frequency or the maximum frequency is reached.

If and when the downward scanning switch 9 is operated at the point D in FIG. 3 in the course of the upward scanning, the flip-flops 18 and 21 are forcibly reset, whereby the downward scanning is started in the direction D' as shown in the dotted line in FIG. 3. If and when the upward scanning switch 8 is operated at the point E in the course of the downward scanning, the upward scanning is started in the direction E' in the similar manner. Thus, it is appreciated that the direction of the scanning can be changed as desired by selective operation of the upward and downward scanning switches 8 and 9 in the course of scanning.

If and when the band switching is made from FM to AM, the band switching signal obtainable through the line 11 from the band selecting switch 10 makes the flip-flop 18 of the up/down mode selecting circuit 6 and the flip-flop 21 of the frequency mode selecting circuit 7 be set, thereby to establish the upward scanning mode and the maximum frequency mode, respectively. Accordingly, the up/down counter 41 for setting the frequency division rate is controlled to operate as an up counter and the data concerning the maximum frequency in the AM band (1605 KHz) is provided from the read only memory 3 to the coincidence circuit 4. At the same time, the up/down counter 41 is responsive to the AM band selecting signal obtainable through the line 25 to load therein the data concerning the minimum frequency of the AM band (535 KHz) obtainable from the read only memory 3. Therefore, as the pulses are applied to the up/down counter 41 from the pulse source 42, the scanning is started in the upward scanning direction from the minimum frequency of 535 KHz of the AM band.

Although the embodiment described in the foregoing was adapted to make upward scanning, starting from the minimum frequency of the corresponding band based on the data as loaded in the up/down counter 41 from the read only memory 3 at the time of the band switching, alternatively the data concerning the maximum frequency in the corresponding band may be loaded in the up/down counter 41 from the read only memory 3, so that downward scanning may be effected in response to the band switching.

Figure 5:
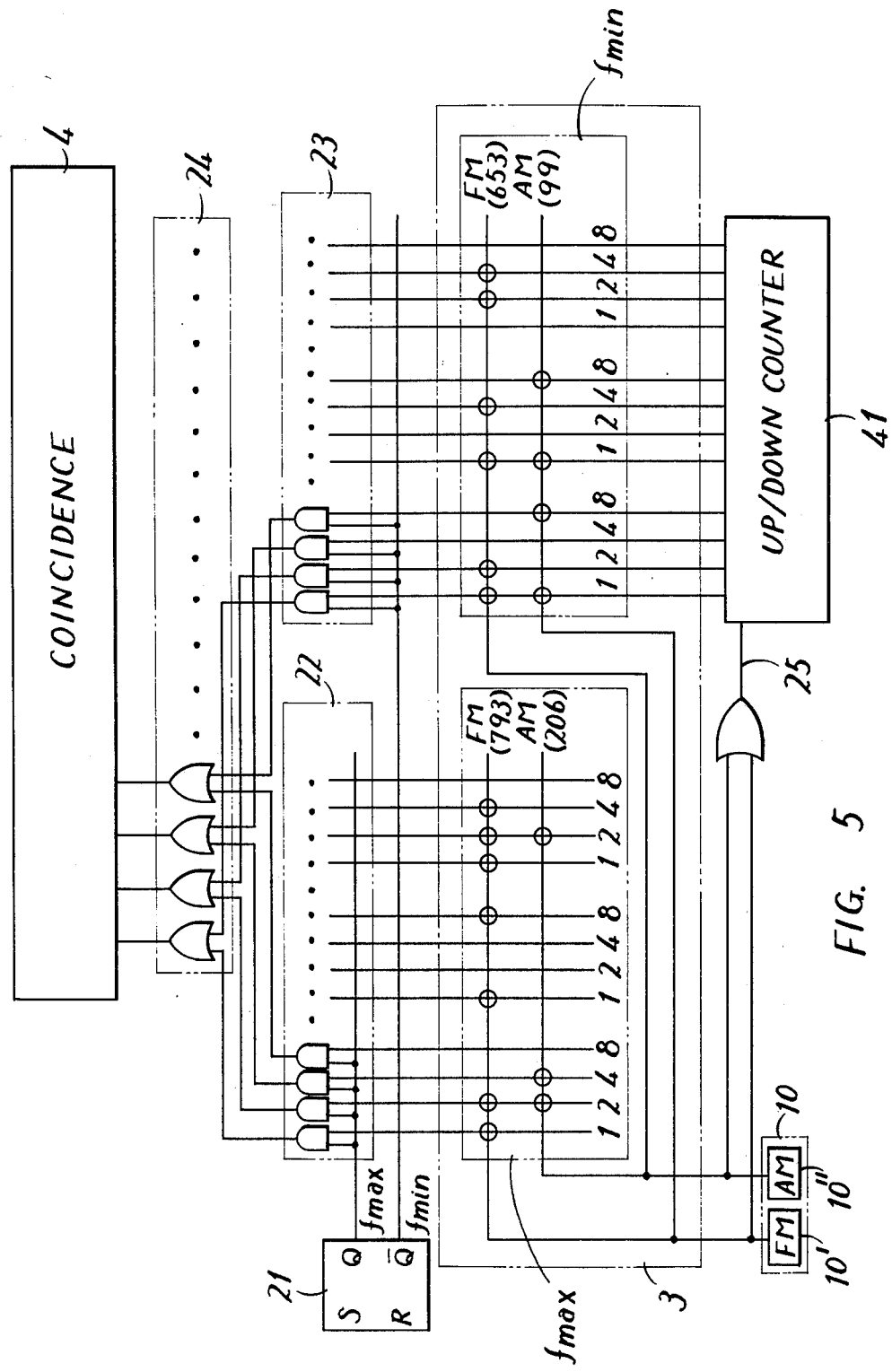
FIG. 5 is a more detailed block diagram of the read only memory 3 in the control circuit of FIGS. 2 and 4.

FIG. 5 is a more detailed block diagram of the read only memory 3 in the FIGS. 2 and 4 control. The data concerning the maximum and minimum frequencies in each of the receiving bands each comprises, at the largest, a three-digit binary coded decimal value corresponding thereto. Thus, the read only memory 3 is shown comprising three sets of column signal lines in each of a maximum frequency region $f_{max}$ and a minimum frequency region $f_{min}$, with each of sets of column line signals comprising four column signal lines corresponding to the bit positions of each digit. The maximum frequency region $f_{max}$ comprises an FM selecting row line connected to the FM selecting switch 10' and an AM selecting row signal line connected to the AM selecting switch 10''. Similarly, the minimum frequency region $f_{min}$ comprises an FM selecting row signal line connected to the FM selecting switch 10' and an FM selecting row signal line connected to the AM selecting switch 10''. With particular reference to the maximum frequency region $f_{max}$ of the read only memory 3, only the intersections marked in circle between the column and row signal lines comprise interconnections for encoding the three-digit binary coded decimal value corresponding to the maximum frequencies in the respective receiving bands. More specifically, the said interconnections marked with a circle each comprise a diode connected from the row signal line to the column signal line with the polarity as dipicted. As a result, if and when the FM selecting switch 10' is depressed, the FM row selecting row signal line is brought to the high level and accordingly only the column signal lines with the said interconnections provided are brought to the high level, thereby to provide a three-digit binary coded decimal value corresponding to the maximum frequency in the FM band. Since the value corresponding to the maximum frequency in the AM band and the minimum frequencies in the FM and AM bands are also similarly obtained, a further description will be omitted. The AND gate 22 comprises three sets of AND gates, each set corresponding to the digit and comprising four bit AND gates, one input to each of these AND gates being connected to receive the set output from the flip-flop 21 and the other inputs to these AND gates being connected to receive the corresponding bit column signal lines in the maximum frequency region $f_{max}$ of the read only memory 3. Similarly the AND gate 23 comprises three sets of AND gates, each set corresponding to the digit and comprising four AND gates, one input of each of these AND gates being connected to receive the reset output from the flip-flop 21 and the other inputs to these AND gates being connected to the corresponding bit column signal lines in the minimum frequency region $f_{min}$ on the read only memory 3. The column signal lines in the minimum frequency region $f_{min}$ of the read only memory 3 are also connected in the parallel manner to the up/down counter 41, such that the three-digit binary coded decimal value represented by the column signal lines can be loaded in the counter 41 in parallel in response to the band selecting signal obtainable at the line 25. The outputs from the AND gates in the blocks 22 and 23 are connected through OR gates in the block 24 to the coincidence circuit 4 in parallel. Thus, it is appreciated that if and when the FM selecting switch 10' is depressed, the FM selecting row lines in the maximum and minimum frequency regions $f_{max}$ and $f_{min}$ are brought to the high level and accordingly the three-digit binary coded decimal values coded by the interconnections marked in circle corresponding to the maximum and minimum frequencies in the FM band are applied in manner parallel manner to the AND gates 22 and 23. Therefore, if and when the flip-flop 21 is set, only the AND gates in the block 22 are enabled and accordingly only the three-digit binary coded value corresponding to the maximum frequency in the FM band is applied through the block 24 to the coincidence circuit 4. On the other hand, if and when the flip-flop 21 is reset, only the AND gates in the block 23 are enabled and accordingly only the three-digit binary coded decimal value corresponding to the minimum frequency in the FM band is applied through the OR gates in the block 24 to the coincidence circuit 4 in the parallel manner. If and when the AM selecting switch 10'' is depressed, similarly only the three-digit binary coded decimal value corresponding to the maximum or minimum frequency in a AM band is selectively applied through the block 24 to the coincidence circuit 4 in the parallel manner depending on the state of the flip-flop 21.

Now that a radio receiver employing an improved digital frequency synthesizer which is capable of being switched to a plurality of receiving bands was described with reference to FIGS. 1 through 5, description will be made in the following of an embodiment of the present invention, which can be advantageously employed in the FIGS. 1 through 5 radio receiver. As well known to those skilled in the art, in a superheterodyne receiver employing a typical digital frequency synthesizer employing a phase locked loop, assuming that the frequency to be received by the receiver is $f_{high}$, the local oscillation frequency is $f_{vco}$ and the intermediate frequency is $f_{int}$, then the following equation is obtained.

$$f_{nigh} = f_{vco} \pm f_{int} = N \cdot f_{sosc} \pm f_{int} \tag{4}$$

Where the oscillation frequency of the reference oscillator of the digital frequency synthesizer is $f_{sosc}$. From equation (4), it is appreciated that the frequency to be received, $f_{nigh}$, is proportional to the frequency division rate N of the programmable frequency divider 40 with the frequency difference commensurate with the intermediate frequency $f_{int}$. This difference in the frequency does not entail any problem only for the purpose of reception of the broadcasting signal. Nevertheless, the said difference in frequency need be compensated in such a case where information representing the frequency to be received, $f_{nigh}$, is required for some purpose such as display of the frequency to be received, $f_{nigh}$, for example, by the use of the variable frequency rate N. Preferably, such a display of the frequency to be received, $f_{nigh}$ is effected based on the variation of the frequency division rate N. On the other hand, the intermediate frequency $f_{int}$ is different depending on the receiving bands, such as the FM band, AM band and the like. In addition, the intermediate frequency $f_{int}$ may be different even for the same receiving band, as the broadcasting standards, including the intermediate frequency $f_{int}$, are different depending on the territory where the receiver is used. Accordingly, it is desired that a multiple-band digital frequency synthesizer receiver is adapted to select a desired intermediate frequency in response to the band switching, thereby to compensate for the difference in the intermediate frequency caused depending on the receiving band, the broadcasting standard, and the like.

Figure 6:
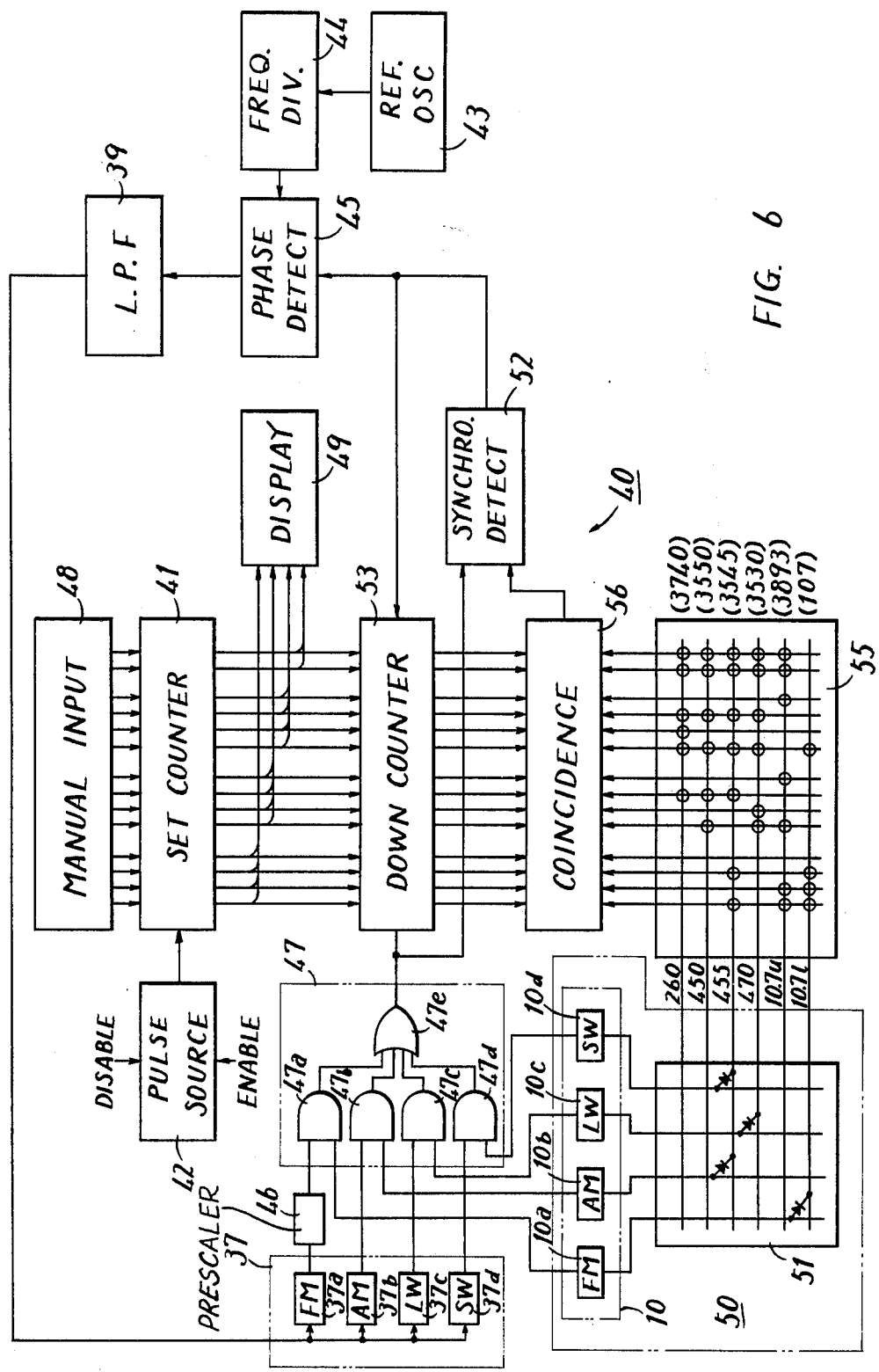
FIG. 6 is a block diagram of a characteristic portion of the present invention.

FIG. 6 is a block diagram of a characteristic portion of the present invention for achieving the above described requirement. As pointed out previously, the present invention can be advantageously employed in the FIGS. 1 through 5 radio receiver. Thus, the characteristic portion of the present invention has been shown in some detail, while like portions of FIGS. 1 through 5 are shown in the blocks designated by like reference characters. Briefly stated, a read only memory 55 is provided for the purpose of storing data concerning various intermediate frequencies to be different depending on the receiving band, the broadcasting standard to be adopted in a given territory and the like. Thus, the data concerning various intermediate frequencies are preselected depending on the bands and the territories and are loaded in advance in the read only memory 55. The read only memory is structured such that it is responsive to the band selecting signal to provide selectively data concerning a desired intermediate frequency. A more detailed description will be given with reference to FIG. 6.

The radio receiver of the embodiment shown comprises a setting counter 41 to be loaded manually or automatically with data concerning the frequency of a broadcasting station to be selected, a down counter 53 responsive to an output from the local oscillator 37 implemented by a voltage controlled oscillator for making a sequential down count of the data transferred from the setting counter 41, the read only memory 55, a band select control 50 responsive to the band selecting output from the band selecting means 10 for withdrawing the data concerning the desired intermediate frequency from the read only memory 55, and a coincidence circuit 56 for detecting coincidence of the data concerning the desired intermediate frequency withdrawn from the read only memory 55 and the data stored in the down counter 53. The setting counter 41 is connected to the pulse source 42, as shown in FIG. 1, and is also connected in parallel bit group manner to the manual input circuit 48. In the embodiment shown, the setting counter 41 comprises four digits, each digit comprising four bits, thereby to constitute a binary coded decimal counter. Accordingly, the setting counter 41 is connected to the manual input circuit 48 and the down counter 53 through sixteen parallel lines. It is appreciated that if the most significant digit is only 3 (0011 in terms of a binary value), at the largest, the most significant digit of these blocks 48, 41, 53, 56 and 55 may be constituted of only two bits. Therefore, there will be only fourteen lines as shown. The said manual input circuit 48 is used to manually input the data concerning the frequency to be received so it can be loaded in the setting counter 41 and may be of a numeral input key to be provided on the control panel of the radio receiver. The relation between the setting counter 41 and the pulse source 42 was described previously. The output from the setting counter 41 is coupled to the said down counter 53 in parallel bit groups and is also coupled to a digital display 49 also in the parallel bit manner. The display 49 is used to display the frequency of a desired broadcasting station to be received.

The said down counter 53 counts down the data loaded from the setting counter 41 upon receipt of each pulse from the local oscillator 37 and provides the parallel output of the coincidence circuit 56. It is pointed out that the local oscillator 37 comprises four voltage controlled oscillators 37a, 37b, 37c and 37d each corresponding to the respective receiving bands in the embodiment shown. The control input to these four oscillators is connected from the low pass filter 39, as described previously, and the outputs from these oscillators are coupled to a switching circuit 47. It is pointed out that since the oscillation frequency of only the voltage controlled oscillator 37a for the FM band is relatively high the output from the oscillator 37a is applied through a prescaler 46 for frequency division to the rate of 1/100 to the switching circuit 47. The switching circuit 47 comprises four AND gates 47a, 47b, 47c and 47d receiving at one input thereto the output from the respective voltage controlled oscillators and an OR gate 47e receiving the outputs from these AND gates. The said AND gates 47a, 47b, 47c and 47d receive at the other input thereto the outputs from the band selecting switches 10a, 10b, 10c and 10d, respectively, of the receiving band selecting means 10. As a result, the corresponding local oscillator output is withdrawn through the switching circuit 47 in response to the band selecting signal and is applied to the said down counter 53. The output from the switching circuit 47 is also applied to a synchronization detecting circuit 52 to be described subsequently.

The output from the said down counter 53 is connected in a parallel bit manner to the coincidence circuit 56 to provide the down count output to the coincidence circuit 56 on the real time basis. The other input to the coincidence circuit 56 is connected from a output of the read only memory 55 in the parallel bit manner. The coincidence output from the coincidence circuit 56 is applied to the said synchronization detecting circuit 52. The synchronization detecting circuit 52 comprises a D flip-flop and serves to synchronize the local oscillation output from the local oscillator 37 fed through the said switching circuit 47 with the coincidence output from the said coincidence circuit 56. The purpose of synchronization will be described in the following. If and when the down count output from the down counter 53 reaches the output from the read only memory 55, the oscillation output is simultaneously applied to the synchronization detecting circuit 52; but since at that time the coincidence is not obtained by the coincidence circuit 56 because of delay in transfer of the pulses and thus the coincidence output has not been withdrawn. The synchronization detecting circuit 52 is used to synchronize both of them. The output from the synchronization detecting circuit 52 is applied to a phase detector 45 as one frequency input thereto and is also applied to the down counter 53 as a preset enable signal. Thus it is appreciated that the FIG. 6 circuit comprises a programmable frequency divider 40 implemented by the down counter 53, the coincidence circuit 56 and the synchronization detecting circuit 52, whereby the local oscillation frequency from the local oscillator 37 is frequency divided.

The said read only memory 55 is loaded in advance with the data concerning the intermediate frequencies of predetermined receiving bands, as described previously. The read only memory 55 is structured in a matrix manner such that four-digit information is stored in the embodiment shown, each digit being shown comprising four bits while the most significant digit in the right side being shown comprising only two bits, because the most significant digit assumes the decimal number 3 (represented by a binary value 11 of two bits), at the largest, in the embodiment shown. As a result, fourteen bit signal lines are provided as column lines of the matrix in the read only memory 55, which are individually connected to the coincidence circuit 56 in a parallel manner. The number of row lines in the matrix is selected to be commensurate with the number of intermediate frequencies to be incorporated in the read only memory 55. In the embodiment shown, six row lines are employed in the matrix. Of these six row lines, the upper five row lines are associated with the data concerning the intermediate frequencies in case of the upper sideband superheterodyne system, while the lowest row line is associated with the data concerning the intermediate frequency of the lower sideband superheterodyne system. The manner of preloading the data concerning the intermediate frequencies is substantially the same as that shown and depicted with reference to the FIG. 5 read only memory 3. Referring to FIG. 6, the values of the intermediate frequencies to be loaded are shown at the left side of the block 55, while the count values corresponding to the respective intermediate frequencies are shown at the right side of the block 55. The small letters u and l following the intermediate frequencies shown lowest two lines indicate the upper sideband superheterodyne system and the lower sideband superheterodyne system, respectively. Thus, it is appreciated that even for the same intermediate frequency 10.7 MHz, the count value concerning the intermediate frequency is different as "3893" and "107" depending on the upper sideband superheterodyne system and the lower sideband superheterodyne system, respectively. The reason is that the programmable frequency divider 40 employs not an up/down counter but a down counter 53, as will be apparent when the description of the operation will proceed in the following.

The row lines of the read only memory 55 are connected from the receiving band selecting control 50. The band select control 50 comprises a band selecting means 10 and a matrix 51. The respective selecting switches 10a, 10b, 10c and 10d of the band selecting means 10 are connected to the column signal lines of the said matrix 51. On the other hand, the row lines of the matrix 51 are individually connected to the row lines of the read only memory 55. Diodes are connected between the row and column lines of the matrix at predetermined intersections and with a polarity shown so as to encode the individual output from the band selecting means 10 into individual outputs for representing the corresponding intermediate frequency, as well known to those skilled in the art.

A description will now be made of the operation of the FIG. 6 embodiment. By way of an example, a case of receiving the FM broadcasting under the Japanese broadcasting standard is considered. As described previously, the range of the frequencies in the FM broadcasting is 76–90 MHz and the intermediate frequency is 10.7 MHz wherein the lower sideband superheterodyne is employed, which means the local oscillator 37a for the FM band should provide an oscillation output of 65.3–79.3 MHz, with the inter-station frequency being 100 KHz. Thus, the frequency division rate N of the programmable frequency divider 40 should vary between 653–793 so that the broadcasting frequency of 76–90 MHz can be received. Assuming that the broadcasting station of the frequency 80.0 MHz is to be received on the foregoing assumption, operation of the FIG. 6 circuit will be described in the following. If and when the FM band selecting switch 10a is depressed, the lowest row line of the matrix 51 is activated and accordingly the lowest row line of the read only memory 55 is activated. Therefore, the data "107" in terms of the decimal value stored in the read only memory 55, i.e. the data concerning the intermediate frequency 10.7 MHz in case of the lower side superheterodyne system, is read out in a parallel bit manner from the read only memory 55 to the coincidence circuit 56. The AND gate 47a of the said switching circuit 47 is enabled in response to the depression of the said band selecting switch 10a and the oscillation output of 69.3 MHz from the FM band local oscillator 37a is frequently divided by 100 by means of the prescaler 46 to the frequency of 693 KHz, which is then applied to the down counter 53. Since the broadcasting station of a frequency 80.0 MHz is to be received, the data "800" is set in the setting counter 41 through application of pulses from the pulse source 42 in case of automatic tuning and through parallel loading of the data from the manual input circuit 48 in case of manual tuning. The data as loaded in the setting counter 41 is applied to the down counter 53 is a parallel bit manner and is also applied to the display 49 in parallel bit manner. The down counter 53 is responsive to each one of the pulses, as frequency divided, from the FM band local oscillator 37a to make sequential down count of the data initially loaded from the said setting counter 41 and to provide the down counted output to the coincidence circuit 56 in a parallel bit manner. If and when the down counted value in the down counter 53 reaches the value "107" as a result of sequential down count from the value "800", coincidence is achieved in the coincidence circuit 56 between the down counted value in the down counter 53 and the data "107" concerning the intermediate frequency in case of the FM band obtainable from the read only memory 55, whereupon the coincidence output is obtained. The synchronization detecting circuit 52 is enabled in response to the said coincidence output to provide one pulse output. Since one pulse output is obtained at every 693 (= 800 − 107) pulses, it follows that the pulses from the FM band local oscillator 37a are frequency divided at the frequency division rate of 693. Since the said output pulse from the synchronization detecting circuit 52 is applied to the down counter 53 as a preset enable signal, the down counter 53 is newly loaded with the data "800" from the setting counter 41, whereupon the down count as described above is started again. While the above described operation cycle is repeated, the phase locked loop is synchronized, whereby the local oscillation frequency is accurately tuned to the frequency 69.3 MHz. In addition, the data "800" in the said setting counter 41 which is representative of the actual frequency to be received in terms of a binary coded decimal is applied to the display 49. As a result, the display 49 can display the frequency to be received without necessity of compensating for the above discussed difference commensurate with the intermediate frequency. Since such a display responsive to a numerical value of a binary coded decimal for providing a visual indication of the numerical value is well known to those skilled in the art, it is not believed necessary to describe the same in detail.

Now consider a case where an AM broadcasting station is received. Reception of an AM broadcasting station is not basically different from the above described reception of an FM broadcasting station, only the difference being that the upper sideband superheterodyne system is employed in case of reception of the AM broadcasting band. Therefore, the data to be obtained from the read only memory 55 for the same intermediate frequency 455 KHz is "3545", as different from the case of the FM band wherein the data "107" is obtained for the intermediate frequency 10.7 MHz which is frequency divided to the frequency 107 KHz by the prescaler 46. This relation will be better understood when the description further proceeds. Now assuming that the broadcasting station of the frequency 900 KHz is to be received, a major difference will be described in comparison with the case of receiving the FM band. Since the upper sideband superheterodyne system is employed, the oscillation frequency of the AM band local oscillator 37b should be 1355 KHz, i.e., should be higher than the frequency to be received by the frequency commensurate with the intermediate frequency. Accordingly, it is appreciated that the programmable frequency divider 40 should make frequency division at the frequency division rate of 1355, in other words, the down counter 53 should make a down count of 1355. However, since the frequency to be received is 900 KHz, the decimal data "900" is loaded in terms of the binary coded decimal in the setting counter 41 and is transferred to the down counter 53, in which sequential down count is made of the said data "900." Accordingly, the down counter 53 starts to down count from the value "900" to make down count for 1355. If and when down count is made of 900, it occurs that in the course of down counting, the decimal value in the down counter 53 becomes 0 and the decimal value in the down counter 53 becomes −1 in the following down count in the mathematical sense. Let it be assumed that the counter 53 comprises a two-bit binary counter in the most significant digit position and a decimal counter in the three less significant digit positions. In the binary coded decimal convention, such a decimal value −1 is a complement with respect to 0 in all bit positions and therefore all the bit positions in the down counter 53 should be 1 in terms of the binary, if and when the down counted value in the counter 53 becomes −1 in terms of the decimal. In other words, the most significant digit becomes 3 in terms of the decimal. On the other hand, the respective decimal counters in the three less significant digit positions in the counter 53 come to load 9 in terms of the decimal, if and when the down counted value in the counter 53 becomes −1 in terms of the decimal, as well known to those skilled in the art. As a result, the counter 53 comes to load "3999" in terms of the decimal value, if and when the down counted value in the counter 53 becomes −1 in terms of the decimal value. Since further down count is continued starting from this value, it follows that down count is continued by 455 until the value in the down counter 53 reaches the value 3545 which has been applied to the coincidence circuit 56 from the read only memory 55. Accordingly, this means that as a result down count has been made of 900 + 455 = 1355 and thus the oscillation frequency of the AM band local oscillator 37b has been frequency divided by the rate 1355. As described above, in case of the upper side superheterodyne system, the value in the down counter 53 becomes once 0 in all the bit positions, whereupon the state in the bit positions is inverted and further down count is continued. To accommodate this operation, therefore, the above described data "3545" corresponding to −455 in terms of a simple mathematical representation concerning the intermediate frequency has been preloaded in the read only memory 55.

The relevant data concerning the intermediate frequencies stored in the read only memory 55 are selected such that the data are adapted to the intermediate frequencies of the receiving bands of the radio receiver and of the broadcasting standard in the territory to which the receivers are shipped, before the receivers are shipped from the factory. According to the present invention, such selection can be effected with ease and as desired by merely changing the inter-connection between the row and column lines in the matrix 51 by means of diodes, since various data concerning the intermediate frequencies have been preloaded in the read only memory 55.

In the FIG. 6 embodiment described in the foregoing, the data of the frequency to be received is loaded through the frequency division rate setting counter 41 to the down counter 53 constituting the programmable frequency divider 40, and down count is effected from the said data as loaded to the value corresponding to the intermediate frequency. In this embodiment, the data is the frequency division rate setting counter 41 directly represents the frequency to be recieved. Therefore, the above described compensation for the frequency commensurate with the intermediate frequency can be achieved with extreme ease. In addition, since the data concerning a plurality of intermediate frequencies are loaded in advance in the read only memory 55 such that any desired ones can be selected by means of the matrix, any desired intermediate frequecies can be set with ease even in case where the intermediate frequency is different depending on the receiving bands and the territory to which the receivers are shipped.

Figure 7:
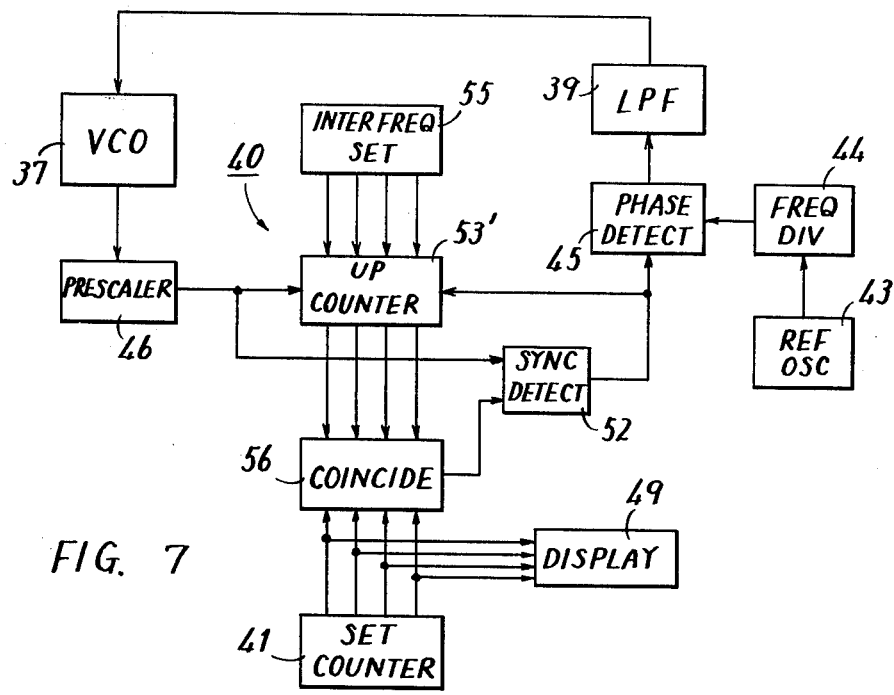
FIG. 7 is a block diagram of a modification of the FIG. 6 embodiment.

FIG. 7 is a block diagram of a modification of the FIG. 6 embodiment, wherein like portions are designated by like reference characters. The FIG. 7 embodiment is basically similar to the FIG. 6 embodiment and, therefore, only the different portion will be described in the following. In the FIG. 7 embodiment, the programmable frequency divider 40 employs an up counter 53' and accordingly the coincidence circuit 56 is provided between the setting counter 41 and the said up counter 53', while an intermediate frequency setting means 55 for presetting the data concerning the intermediate frequency is provided so as to set the data concerning the intermediate frequency to the up counter 53' in response to the present enable signal from the synchronization detecting circuit 52. It is pointed out that the intermediate frequency setting means 55 corresponds to the read only memory 55 in the FIG. 6 embodiment. Since the remaining portions in the FIG. 7 embodiment are substantially the same as those in the FIG. 6 embodiment, the major portions are illustrated in a simplified manner.

Now description will be made of the operation of the FIG. 7 embodiment in the following. For simplicity of explanation, consider a case where the broadcasting station of 80.0 MHz is to be received by an FM radio receiver of the lower sideband superheterodyne system. Accordingly, the intermediate frequency setting means 55 has been loaded with the data "107" concerning the intermediate frequency 10.7 MHz. On the other hand, since the broadcasting station of 80.0 MHz is to be received, the setting counter 41 is loaded with the data "800," which is applied in a parallel bit manner to the coincidence circuit 56. The data "107" loaded in the said intermediate frequency setting means 55 is applied to the said up counter 53'. The up counter 53' makes an up count of one upon receipt of each of the pulses, as frequency divided by the prescaler 46, of the local oscillation output of 693 KHz obtainable from the voltage controlled oscillatory 37. Therefore, the up counter 53' makes an up count starting from "107" and the up counted value in the counter 53' is applied in a parallel bit manner to the coincidence ciruit 56. If and when the up counted value in the up counter 53' reaches the value 800, a coincidence output is obtained from the coincidence circuit 56 and is applied to the synchronization detecting circuit 52. Thereafter, therefore, the same operation as in the FIG. 6 embodiment is effected in the FIG. 7 embodiment. More specifically, one pulse is applied through the synchronization detecting circuit 52 to the phase detector 45 at every 693 pulses (693 = 800 − 107), with the result that the local oscillation frequency from the local oscillator 37 is frequency divided by means of the programmable frequency divider 40 at the frequency division rate of 693. Thus, the same result is achieved as in the FIG. 6 embodiment.

Although in the foregoing only reception of the FM band by means of a radio receiver employing the lower sideband superheterodyne system was described, the FIG. 7 embodiment can also be applied to a radio receiver employing the upper sideband superheterodyne system by setting the value "−107" in the intermediate frequency setting means 55. In this connection, it is pointed out that the above described values are merely indicated mathematically in terms of the decimal numbers and according to the binary coded decimal convention it is necessary to set the value "3893" after the complement is obtained, as described previously. Although the intermediate frequency setting means 55 is illustrated in a simplified manner in the FIG. 7 embodiment, of course the intermediate frequency setting means 55 may be implemented by a read only memory of the same structure as that of the read only memory 55 in the FIG. 6 embodiment, such that the data concerning various intermediate frequencies corresponding to various receiving bands and various territories are stored in advance and can be selected as desired depending on the receiving bands and the territories, as fully described previously.

Figure 8:
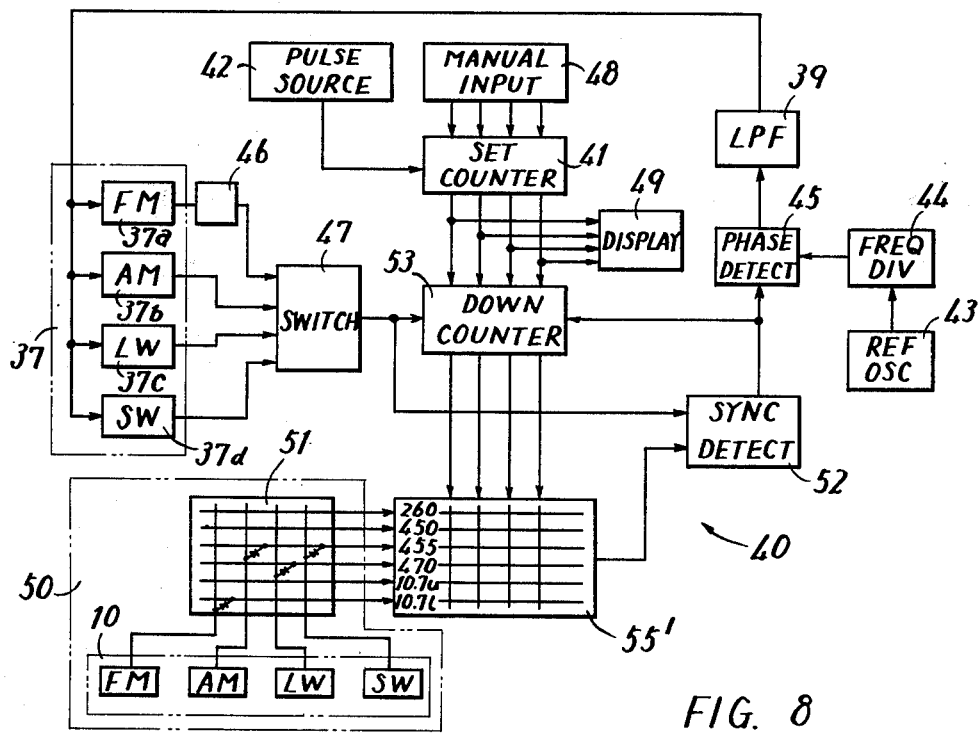
FIG. 8 is a block diagram of another embodiment of the present invention.

FIG. 8 is a block diagram of another embodiment of the present invention which is similar to the FIG. 6 embodiment. A different portion in comparison with the FIG. 6 embodiment is that in the FIG. 6 embodiment the coincidence output is obtained by the coincidence circuit 56 in response to the output from the down counter 53 and the output from the read only memory 55, whereas in the FIG. 8 embodiment the coincidence is adapted to be obtained by the read only memory 55', thereby to dispense with the coincidence circuit 56. Thus, the read only memory 55' is structured in a slightly different manner, while the remaining portions are of substantially the same structure as that of the FIG. 6 embodiment. Therefore, like portions are designated by like reference numerals and are not described again. Therefore, only the read only memory 55' will be described in more detail in the following.

Figure 9:
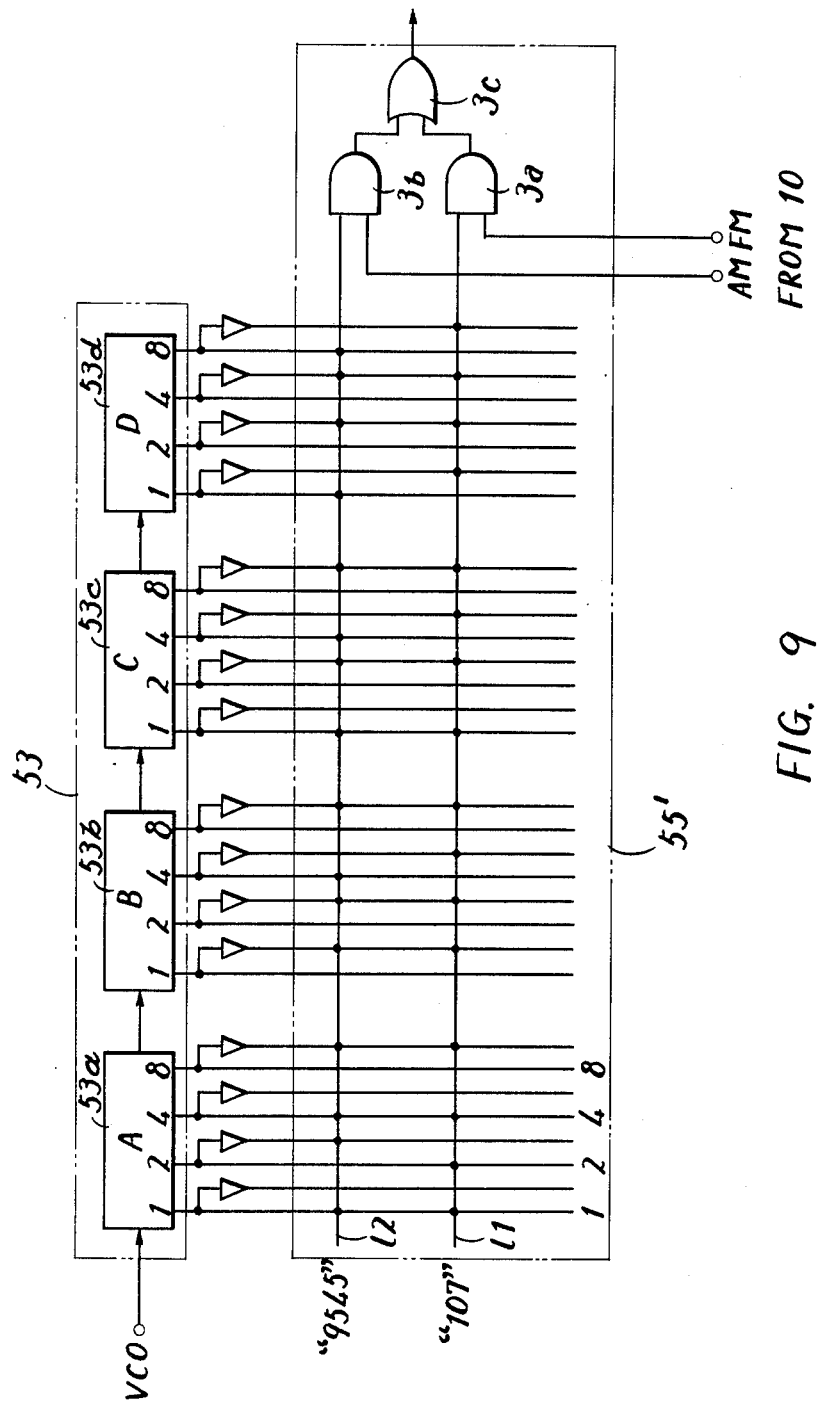
FIG. 9 is a more detailed block diagram of the read only memory 55' and the down counter 53 connected thereto of FIG. 8.

FIG. 9 is a more detailed block diagram of only the read only memory 55' and the down counter 53 connected thereto, while the remaining portions are omitted for simplicity of illustration. It is pointed out that although in the FIG. 6 embodiment six row lines are shown, in the FIG. 9 embodiment only the row line *l*1 concerning the intermediate frequency of the FM band under the lower sideband superheterodyne system and the row line *l*2 concerning the intermediate frequency of the AM band under the upper sideband superheterodyne system are shown for simplicity of illustration. It is further pointed out that the FIG. 6 embodiment comprises two-bit structure in the most significant digit whereas the FIG. 9 embodiment comprises four-bit structure in all digit positions.

Referring to FIG. 9, the down counter 53 comprises a four digit down counters 53a, 53b, 53c and 53d, each constituting the respective digit. Each of the digit down counters comprises four-bits, the digit counter 53a corresponding to the least significant digit position and the digit down counter 53d corresponding to the most significant digit. The bit outputs from the respective digit down counters are directly connected to the column lines of the read only memory 55' and also connected through inverters to another set of column lines of the read only memory 55'. The bit outputs from each digit counter are weighted 1, 2, 4 and 8 in order from left to right. The read only memory 55' is preloaded with the data concerning the intermediate frequencies, by coding it through a combinatin of the direct outputs and inverted outputs of the bit outputs from the digit counters 53a, 53b, 53c and 53d. More specifically, paired column lines of the direct bit output and the inverted bit output constitute one bit position and the data is coded by provision of diodes in predetermined intersections between the column and row lines. The coincidence between the coded value in the read only memory 55' and the output from the counter 53 is evaluated based on whether a logical product is established by the said intersection connections. For examples, the data "107" concering the intermediate frequency of the FM band is coded by provision of diodes in the intersections between the row line *l*1 and the column lines, as shown in FIG. 9. With particular reference to the least significant digit region in the FIG. 9 embodiment, the data "7", i.e., 0111 in terms of the binary code, is to be stored and therefore the intersection connections as shown by a solid circle are provided between the row line *l*1 and the column lines of the direct bit outputs weighted of 1, 2 and 4 from the counter 53a, while the intersection connection is provided in the intersection between the row line *l*1 and the column line of the inverted bit output weighted of "8" from the counter 53a. If and when the counted value in the counter 53a reaches 0111, all column lines marked with a solid circle in the least significant digit position assumed the high level, whereby a logical product is obtained as a function of the high level of the row line *l*1. If and when the counted value in the counter 53a is not 0111, at least one of the column lines marked with a solid circle is not brought to the high level and accordingly a logical product is not obtained. Although in the foregoing the operation of only the least significant digit position was described, the same applies to the other digit positions. Thus, according to the FIG. 9 embodiment, coincidence is evaluated in the read only memory 55' between the counted value in the down counter 53 and the data concerning the intermediate frequency preloaded in the read only memory 55'. The said row line *l*1 is connected to one input of an AND gate 3a and the row line *l*2 is connected to one input of an AND gate 3b. The other input to the other AND gate 3a is connected to the FM band selecting switch 10a and the other input to the AND gate 3b is connected to the AM band selecting switch 10b. Therefore, if and when the said coincidence output is obtained from the row line *l*1 while the FM band selecting switch 10a is depressed, the said coincidence output is applied through the AND gate 3a and an OR gate 3c to the synchronizing detecting circuit 52.

According to a superheterodyne radio receiver employing the frequency synthesizer of the foregoing embodiment, the frequency to be received can be displayed in a digital manner, while the direction of scanning can be reversed as desired in the course of scanning operation with stability and accuracy of the local oscillation frequency. On the other hand, another problem arises in that the inter-station frequency, i.e., the frequency difference of the adjacent two broadcasting stations, is fixed which results in a dilemma where reception becomes impossible if the inter-station frequency is changed by way of revision of the broadcasting standard. For example, according to the current Japanese broadcasting standard, the inter-station frequency of the AM band is 10 KHz and the inter-station frequency of the FM band is 100 KHz. Some countries, however, adopt a different broadcasting standard in which the inter-station frequency of the AM band is 9 KHz and the inter-station frequency of the FM band is 200 KHz. Accordingly, the fixed inter-station frequency of a frequency synthesizer receiver can cause an extreme inconvenience that reception becomes impossible when the inter-station frequency of the broadcasting standard is revised, a synthesizer receiver adapted to the broadcasting standard in one country is used in another country of a different broadcasting standard in connection with the inter-station frequency, and the like. Thus, it is desired that such inter-station frequency to be achieved by such a frequency synthesizer receiver can be adaptably changed with ease.

Figure 10:
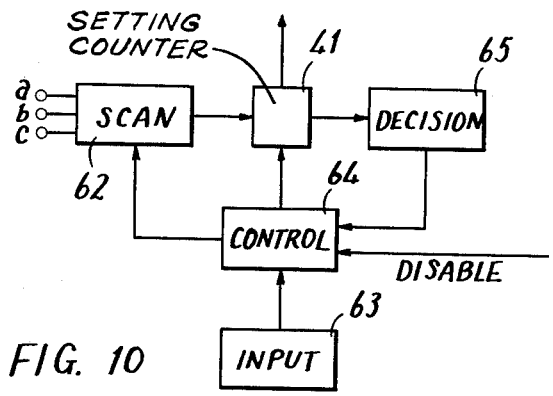
FIG. 10 is a block diagram of a major portion of an improved frequency synthesizer wherein the inter-station frequency can be adaptably changed.

FIG. 10 is a block diagram of only a major portion of an improved frequency synthesizer wherein the inter-station frequency can be adaptably changed. The basic concept of a superheterodyne radio receiver to which the FIG. 10 frequency synthesizer is to be employed is the same as discussed previously. The FIG. 10 embodiment comprises an input circuit 63 for inputting a command signal for scanning by means of such as the band selecting switch, the scanning direction selecting switch and the like, a control 64 responsive to the command signal from the input circuit 63 for generating a control signal, a scanning circuit 62 responsive to the control signal from the control 64 for applying the pulses to the setting counter 41, and a decision circuit 65 for determining whether the counted value in the counter 41 is the data concerning the upper limit frequency or the data concerning the lower limit frequency in the corresponding band for providing a switching signal for switching the scanning direction. The scanning circuit 62 corresponds to the pulse source 42 in the FIG. 1 receiver and, in the embodiment shown, has three switching terminals a, b and c directly related to the switching of the inter-station frequencies, whereby preselection of any one of the terminals accommodates the scanning circuit 62 to provide the scanning pulses of an adapted frequency. Although a detailed block diagram of the scanning circuit 62 will be described subsequently with reference to FIG. 11, it is pointed out that the embodiment now in discussion resides in an improvement in the scanning circuit 62. Accordingly, the remaining blocks of the FIG. 10 embodiment may be the same as those discussed with reference to FIGS. 1 through 9. For example, the decision circuit 65 corresponds to the blocks 4, 6 and 7 in the FIG. 2 diagram and the input circuit 63 corresponds to the band selecting switch 10 in FIGS. 2 and 3 and the control 64 may be considered to show generally the connection between these blocks.

Figure 11:
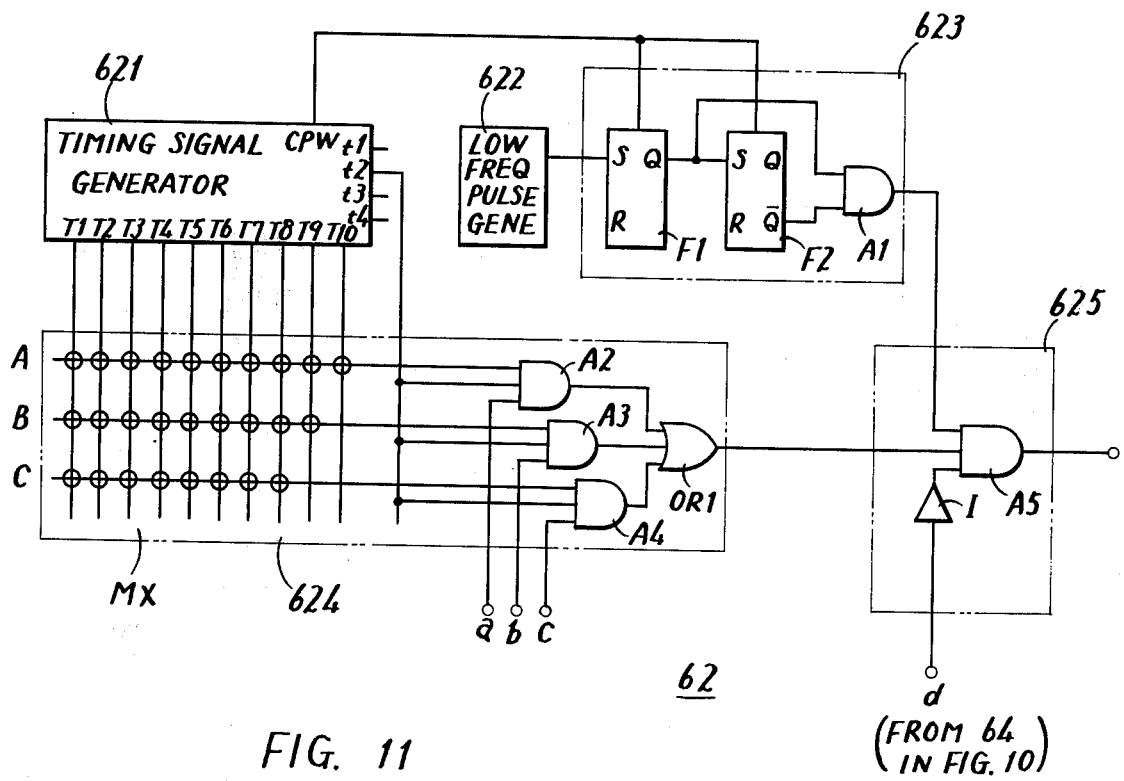
FIG. 11 is a detailed block diagram of the scanning circuit 62 constituting the major portion of the FIG. 10 embodiment.
Figure 12:
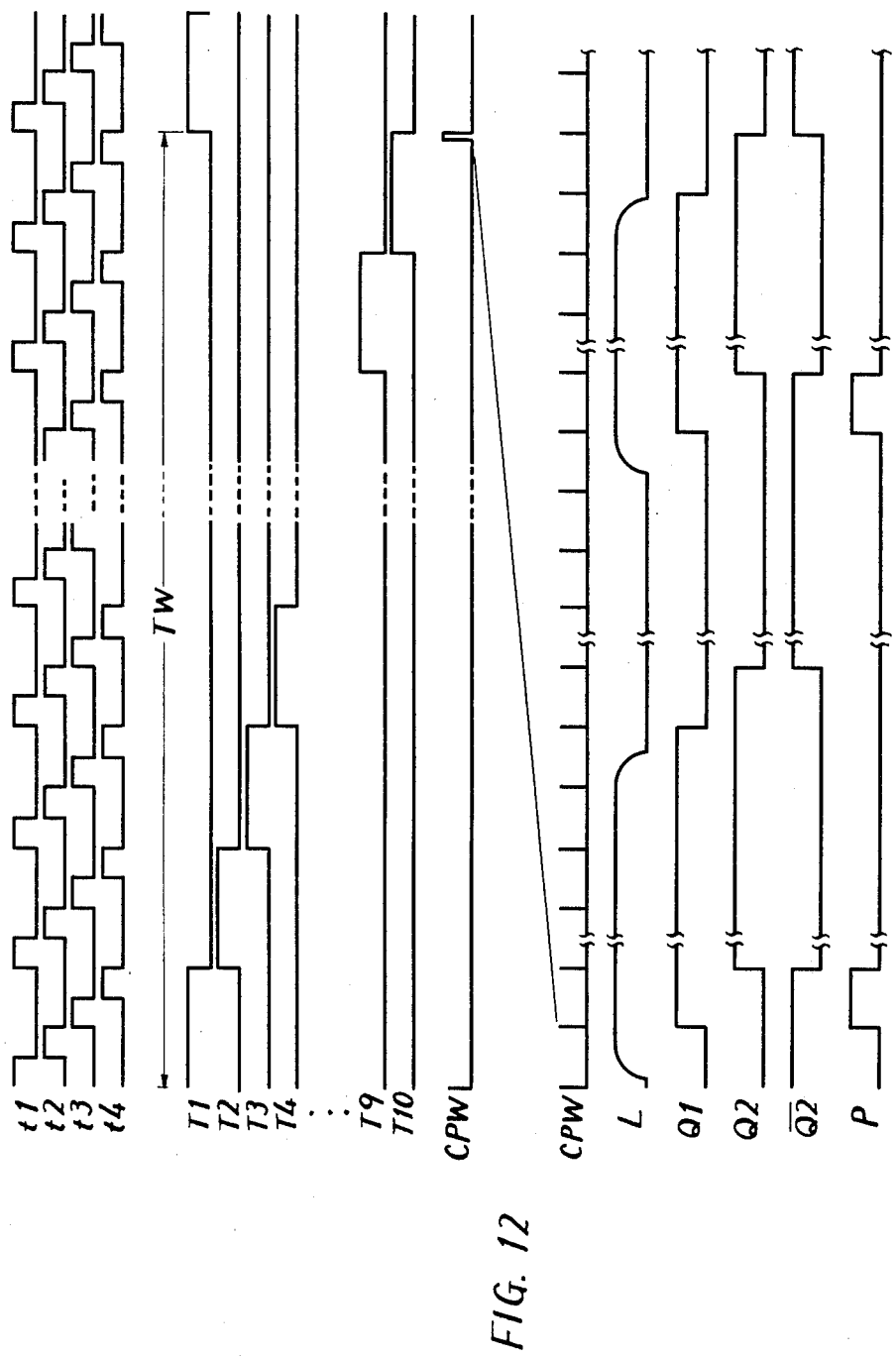
FIG. 12 shows waveforms of the timing signals and the signals at various portions of the embodiment for use in explanation of the operation of the FIG. 11 embodiment.

FIG. 11 is a detailed block diagram of the scanning circuit 62 constituting the major portion of the FIG. 10 embodiment. FIG. 12 shows waveforms of the timing signals and the signals at various portions of the embodiment for use in explanation of the operation of the FIG. 11 embodiment. A description will be made of the structure and operation of the FIG. 11 embodiment with reference to the waveforms shown in FIG. 12. Referring to FIG. 11, the scanning circuit 62 comprises a timing signal generator 621, a low frequency pulse generator 622, a leading edge triggering circuit 623 responsive to the word clock pulse CPW (to be described subsequently) from the timing signal generator 621 for withdrawing one word leading portion of the pulses from the low frequency pulse generator 622, a setting circuit 624 receiving the timing signal from the timing signal generator 621 for selectively setting the pulse number to be withdrawn from the scanning circuit 62, and a gating circuit 625 for gating the output from the leading edge triggering circuit 623 and the output from the setting circuit 624. The timing signal generator 621 is structured to generate minor timing signals $t1$ through $t4$ and major timing signals T1 through T10 and a word clock pulse CPW, as shown in FIG. 12. In general, one cycle TW of the major timing signals T1 through T10 is called one word and the word clock pulse CPW is adapted to occur for the time period TW. The low frequency pulse generator 622 is implemented by a bistable multivibrator which generates pulses at the interval of about 100 milliseconds, which is of a relatively long cycle, as shown as L in FIG. 12.

The leading edge triggering circuit 623 comprises flip-flops F1 and F2 and an AND gate A1. The pulses from the low frequency pulse generator 622 is applied to the set input to the first flip-flop F1. The flip-flop F1 is set by the pulse L to be applied to the set input thereto in synchronizm with the word clock pulse CPW from the timing signal generator 621. The set output therefrom is shown as Q1 in FIG. 12. The set input to the second flip-flop F2 is connected to the set output from the first flip-flop F1. Accordingly, the second flip-flop F2 is set by the set output Q1 of the first flip-flop F1 in synchronism with the word clock pulse CPW. The set output is shown as Q2 in FIG. 12. The set output Q1 of the first flip-flop and the reset output $\bar{Q}2$ of the second flip-flop ($\bar{Q}2$ in FIG. 12) are ANDed by an AND gate A1. As a result, the output from the AND gate A1 is the leading portion of one word of the low frequency pulse (L in FIG. 12) as withdrawn in synchronism with the first word clock pulse CPW and is obtained at intervals of about 100 milliseconds.

The setting circuit 624 comprises a matrix MX including column lines individually connected to the major timing signals T1 through T10 and three row lines A, B and C, three AND gates A2, A3 and A4 and an OR gate OR1. With particular reference to the matrix Mx, the circle marks shown in the predetermined intersections between the row and column lines indicate the interconnections for obtaining a logical sum of the row and column signals. The row lines A, B and C are individually connected to one input to AND gates A2, A3 and A4, respectively. The second input to the AND gates A2, A3 and A4 are connected commonly to receive the minor timing signal $t2$ from the timing signal generator 621. The third inputs to the AND gates A2, A3 and A4 are connected to the said switching terminals a, b and c, respectively. The outputs from the And gates A2, A3 and A4 are applied through the OR gate OR1 to the gating circuit 625.

Now consider the operation of the setting circuit 624. Assuming that the switching terminal a is selected, an enabling signal is applied to the third input to the AND gate A2 through the switching terminal a. Accordingly, the AND gate A2 is made to evaluate the logical product of the signal on the row line A and the minor timing signal $t2$. Since all of the major timing signals T1 through T10 are withdrawn on the row line A and are applied sequentially to the first input to the AND gate A2, the AND gate A2 is caused to take out ten minor timing pulses t2 during one word time period to apply them through the OR gate OR1 to the gating circuit 625. Similarly, assuming that the switching terminal b is selected, nine minor timing pulses $t2$ are withdrawn during one word time period. If and when the switching terminal c is selected, eight minor pulses $t2$ are withdrawn during one word time period. The pulses thus withdrawn from the setting circuit 624 are applied to the gating circuit 625. The gating circuit 625 comprises an AND gate A5 and an inverter I. The first input to the AND gate A5 is connected to the output from the leading edge triggering circuit 623, the second input thereto is connected to the output from the setting circuit 624 and the third input thereto is connected to the output from the inverter I. The inverter I is connected to receive a control signal representative of the state of reception from the control 64. Accordingly, during the state of receiving a given broadcasting station, the control signal is inverted by the inverter I to be applied to the AND gate A5, whereby the AND gate A5 is disabled. On the contrary, if the receiver is not in the state of receiving any broadcasting station, the AND gate A5 is enabled. If the when the AND gate A5 is enabled, the output from the leading edge triggering circuit 623 (P in FIG. 12) and the output from the setting circuit 624 are ANDed. In other words, it follows that during each one word time period of the output P the pulses of the number determined as withdrawn per one word from the setting circuit 624 are withdrawn by way of the scanning pulses. As described previously, the pulses P are generated at an interval of about 100 milliseconds. Therefore, ten scanning pulses, for example, are withdrawn for every 100 milliseconds. The number of pulses of say 10 can be changed to 9 or 8, as fully described previously. Thus it is appreciated that it is possible to change the inter-station frequency of a frequency synthesizer receiver by controllably changing the number of scanning pulses per unit time.

Although this invention has been described and illustrated in detail, it is to be clearly understood that the same is by way of illustration and example only and is not to be taken by way of limitation, the spirit and scope of this invention being limited only by the terms of the appended claims.

It is claimed:

1. A multiple-band superheterodyne receiver, comprising means for receiving a plurality of receiving frequency bands each containing high frequency signals of different frequencies, local oscillating means for providing an oscillation frequency signal the frequency of which is different by a given frequency difference from a said received high frequency signal, mixing means responsive to a said received high frequency signal in a given receiving frequency band and said local oscillation frequency signal for providing an intermediate frequency signal, means for selecting one of said plurality of receiving frequency bands for reception, and means for setting information concerning the frequency of a high frequency signal to be received in a selected receiving frequency band, said local oscillating means comprising voltage controlled oscillating means for providing an oscillation frequency signal the oscillation frequency of which is variable as a function of a given control voltage, means for storing information concerning a plurality of frequency differences, each corresponding to one of said plurality of receiving frequency bands and responsive to the operation of said band selecting means for selectively withdrawing the information concerning the frequency differences of the corresponding selected receiving frequency band, first means responsive to said withdrawn information concerning said frequency difference and said information concerning the frequency of a high frequency signal to be received for producing an output at a first frequency which is a function of the sum or difference of said two pieces of information, and means responsive to the output from said first means for providing a control voltage to said voltage controlled oscillating means, whereby said local oscillating means provides a local oscillation frequency signal the frequency of which is function of the output of said first means which in turn is a function of said two pieces of information.

2. A multiple-band superheterodyne receiver in accordance with claim 1, which further comprises means responsive to said high frequency information setting means for providing an indication of the frequency of a high frequency signal to be received.

3. A multiple-band superheterodyne receiver in accordance with claim 1, wherein said first means further comprises means responsive to the operation of said band selecting means for changing the frequency of said first frequency for enabling reception of the frequencies in the corresponding selected receiving band.

4. A multiple-band superheterodyne receiver in accordance with claim 1, in which said control voltage providing means comprises
means for providing a reference frequency signal, and
means responsive to the output from said first means and the output from the said reference frequency signal providing means for detecting the frequency difference between the frequency of the output from said first means and the frequency of said reference frequency signal for providing said control voltage to said voltage controlled oscillating means.

5. A multiple-band superheterodyne receiver in accordance with claim 4, in which said first means comprises means for receiving and dividing the frequency of the output from said voltage controlled oscillating means.

6. A multiple-band superheterodyne receiver in accordance with claim 1, in which said high frequency information setting means comprises
means for generating scanning pulses, and
means responsive to said scanning pulses for generating said information concerning the frequency of a high frequency signal to be received.

7. A multiple-band superheterodyne receiver in accordance with claim 6, in which said high frequency information setting means further comprises
means for selecting setting information concerning the inter-station frequency of broadcasting high frequency signals, and
means responsive to the output from said inter-station frequency information setting means for controlling the frequency of said scanning pulse providing means for changing said interstation frequency of said superheterodyne receiver.

8. A multiple-band superheterodyne receiver in accordance with claim 1, in which said first means comprises
counting means responsive to the output from said high frequency information setting means and an enable signal to be initially loaded with said information concerning the frequency of a high frequency signal to be received and to the output from said voltage controlled oscillating means for making a counting operation with respect to said initially loaded information as a function of the output from said voltage controlled oscillating means, and
means responsive to said counting means and said frequency difference information storing means for detecting where the counted information in said counting means corresponds in a predetermined manner to the information concerning the corresponding frequency difference obtained from said frequency difference information storing means for providing said enable signal and said output of first frequency.

9. A multiple-band superheterodyne receiver in accordance with claim 8, in which said detecting means comprises a coincidence circuit for detecting coincidence of the counted information is said counted means and the information concerning the frequency difference obtained from said storing means.

10. A multiple-band superheterodyne receiver in accordance with claim 9, in which said counting means comprises a down counter.

11. A multiple-band superheterodyne receiver in accordance with claim 1, in which said first means comprises
counting means responsive to the output from said frequency difference information storing means and an enable signal to be initially loaded with said information concerning the frequency difference and to the output from said voltage controlled oscillating means for making a counting operation with respect to said intially loaded information as a function of the oscillation frequency output from said voltage controlled oscillating means, and
means responsive to said counting means and said high frequency information setting means for detecting when the counted information in said counting means corresponds in a predetermined manner to said information concerning the frequency of a high frequency signal to be received obtained from said high frequency information setting means for providing said enable signal and said output of first frequency.

12. A multiple-band superheterodyne receiver in accordance with claim 11, in which said detecting means comprises a coincidence circuit for detecting coincidence of the counted information in said counting means and the information concerning the frequency of a high frequency signal to be received obtained from said high frequency information setting means.

13. A multiple-band superheterodyne receiver in accordance with claim 12, in which said counting means comprises an up counter.

* * * * *

UNITED STATES PATENT OFFICE
CERTIFICATE OF CORRECTION

Patent No. 4,048,570　　　　　　　　　　Dated September 13, 1977

Inventor(s) Yasuaki Sumi

It is certified that error appears in the above-identified patent and that said Letters Patent are hereby corrected as shown below:

Change item [73] to read:

"Assignees: Sanyo Electric Co., Ltd.
of Moriguchi-shi, Osaka-fu, Japan; and
Tottori Sanyo Electric Co., Ltd. of
Tottori-shi, Tottori-ken, Japan"

Signed and Sealed this

Twenty-first Day of February 1978

[SEAL]

Attest:

RUTH C. MASON　　　　　　LUTRELLE F. PARKER
*Attesting Officer*　　*Acting Commissioner of Patents and Trademarks*